United States Patent
Lee et al.

(10) Patent No.: US 8,593,612 B2
(45) Date of Patent: Nov. 26, 2013

(54) LIQUID CRYSTAL DISPLAY PANEL CUTTING SYSTEM AND METHOD AND LIQUID CRYSTAL DISPLAY DEVICE FABRICATING METHOD USING THE SAME

(75) Inventors: Jeong-Joon Lee, Incheon (KR); Young-Min Hwang, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 1109 days.

(21) Appl. No.: 11/320,978

(22) Filed: Dec. 30, 2005

(65) Prior Publication Data

US 2006/0285064 A1    Dec. 21, 2006

(30) Foreign Application Priority Data

Jun. 20, 2005  (KR) .................. 10-2005-0053203

(51) Int. Cl.
  *G02F 1/13*   (2006.01)
(52) U.S. Cl.
  USPC ....................................... 349/187
(58) Field of Classification Search
  USPC .................. 349/187; 700/121; 451/41, 44
  See application file for complete search history.

(56) References Cited

U.S. PATENT DOCUMENTS

| | | | |
|---|---|---|---|
| 6,487,350 B1 | 11/2002 | Veligdan et al. | |
| 2001/0022637 A1* | 9/2001 | Yu | 349/102 |
| 2002/0173871 A1* | 11/2002 | Byun et al. | 700/121 |
| 2003/0024909 A1* | 2/2003 | Hoekstra et al. | 219/121.69 |
| 2003/0147035 A1* | 8/2003 | Chae et al. | 349/158 |
| 2003/0178134 A1 | 9/2003 | Muramoto et al. | |
| 2004/0074366 A1 | 4/2004 | Choo et al. | |
| 2005/0184143 A1* | 8/2005 | Liu et al. | 235/375 |
| 2005/0248715 A1* | 11/2005 | Byun et al. | 349/187 |
| 2006/0285063 A1* | 12/2006 | Jo et al. | 349/187 |

FOREIGN PATENT DOCUMENTS

| | | | | |
|---|---|---|---|---|
| CN | 1496798 | 5/2004 | | |
| DE | 3926675 | 5/1993 | | |
| JP | 06-102480 | 4/1994 | | |
| JP | 06102480 A | * | 4/1994 | ............... G02F 1/13 |
| JP | 2000-086262 | 3/2000 | | |
| JP | 2002-316829 | 10/2002 | | |
| JP | 2003-094393 | 4/2003 | | |
| JP | 2003292331 A | * | 10/2003 | ............ C03B 33/023 |
| JP | 2003-313036 | 11/2003 | | |
| JP | 2004-145337 | 5/2004 | | |
| JP | 2004-224601 | 8/2004 | | |
| JP | 2004-348111 | 12/2004 | | |
| JP | 2006154111 | 6/2006 | | |

(Continued)

OTHER PUBLICATIONS

"Color Liquid Crystal Display"; Science Press; p. 172; Mar. 2003.

(Continued)

*Primary Examiner* — Jessica M Merlin
(74) *Attorney, Agent, or Firm* — McKenna, Long & Aldridge, LLP

(57) ABSTRACT

A liquid crystal display panel cutting system for cutting a substrate by varying a driving condition of a cutting wheel according to characteristics the glass substrate. The system comprising a table on which the substrate is loaded, a cutting wheel for forming scribing lines at a surface of the substrate, and a controller for driving the cutting wheel by controlling a driving condition of the cutting wheel based upon the characteristics of the substrate.

6 Claims, 6 Drawing Sheets

(56) References Cited

FOREIGN PATENT DOCUMENTS

| KR | 10-2003-0089188 | 11/2003 |
| KR | 10-2004-0035508 | 4/2004 |
| TW | 411398 B | 11/2000 |
| TW | 200408515 | 6/2004 |
| WO | WO 2004/067243 | 8/2004 |
| WO | WO 2005/028172 | 3/2005 |

OTHER PUBLICATIONS

Newest Technology of Liquid Crystal-Properties of Matter Application; Chemistry Industry Press; Oct. 1991.

"Effect of Scribe-Wheel Dimensions of the Cutting of AMLCD Glass Substrate"; Ono, et al.; Journal of the Society for Information Display; vol. 9, No. 2, pp. 87-94.

"Scribe and Break Machines for LCD Manufacturing"; Joyo Engineering.

* cited by examiner

LIQUID CRYSTAL DISPLAY PANEL CUTTING SYSTEM AND METHOD AND LIQUID CRYSTAL DISPLAY DEVICE FABRICATING METHOD USING THE SAME

This application claims the benefit of Korean Patent Application No. 2005-53203, filed on Jun. 20, 2005, which is hereby incorporated by reference for all purposes as if fully set forth herein.

BACKGROUND OF THE INVENTION

1. Field of the Invention

The present invention relates to a liquid crystal display panel cutting system and a liquid crystal display device fabricating method, and particularly, to a liquid crystal display panel cutting system and a method thereof capable of preventing a cutting wheel from being damaged due to excessive cutting of a substrate by varying pressure and rotating speed of the cutting wheel which cuts substrates according to types of substrates to be cut.

2. Discussion of the Related Art

Generally, a liquid crystal display device provides liquid crystal cells arranged in a matrix form with corresponding data signals according to image information to display a desired image by controlling light-transmittance of each liquid crystal cell.

Accordingly, the liquid crystal display device is provided with a liquid crystal display panel in which liquid crystal cells are arranged in a matrix form; and a driver integrated circuit (IC) for driving the liquid crystal cells of the liquid crystal display panel.

The liquid crystal display panel is composed of a color filter substrate and a thin film transistor array substrate facing to each other; and a liquid crystal layer formed therebetween.

On the thin film transistor array substrate of the liquid crystal display panel, a plurality of data lines that transmit data signals supplied from a data driver integrated circuit to the liquid crystal cells are perpendicular to a plurality of gate lines that transmit scan signals supplied from a gate driver integrated circuit to the liquid crystal cells. Herein, the liquid crystal cells are arranged at crossings of the data lines and the gate lines.

The gate driver integrated circuit supplies the scan signals to the plurality of gate lines sequentially so that the liquid crystal cells arranged in a matrix form can be sequentially selected line by line. Also, the data signals are supplied to the liquid crystal cells of the selected line from the data driver integrated circuit through a plurality of data lines.

A common electrode and a pixel electrode are respectively formed at the inner sides of the color filter substrate and the thin film transistor array substrate facing to each other, thereby applying an electric field to the liquid crystal layer. The pixel electrode is formed to correspond to each liquid crystal cell formed on the thin film transistor array substrate. And, the common electrode is integrally formed on an entire surface of the color filter substrate. Accordingly, light-transmittance of the liquid crystal cells can be separately controlled by controlling a voltage applied to the pixel electrode under a state that a voltage is applied to the common electrode.

Like this, a thin film transistor used as a switching device is formed at the respective liquid crystal cells to control the voltage applied to the pixel electrode formed on each liquid crystal cell.

The plurality of thin film transistor array substrates are formed on a large mother substrate and the plurality of color filter substrates are formed on another mother substrate. Then, the two mother substrates are bonded, so that a plurality of liquid crystal display panels are formed at the same time to improve yield. Herein, a process for cutting the bonded substrates into unit liquid crystal display panels is required.

Generally, the cutting process of the unit liquid crystal display panels includes forming a scribing line at a surface of the mother substrate using a diamond wheel having a hardness greater than that of glass, and breaking the substrate by applying a mechanical force thereto. Hereinafter, a general liquid crystal display panel will be explained with reference to the attached drawings.

FIG. 1 is an exemplary view showing a schematic planar structure of a unit liquid crystal display panel prepared by bonding a thin film transistor array substrate and a color filter substrate of the liquid crystal display device to each other.

In FIG. 1, a liquid crystal display panel 10 comprises: an image display unit 13 having liquid crystal cells arranged in a matrix form; a gate pad unit 14 connected to gate lines of the image display unit 13; and a data pad unit 15 connected to data lines. At this time, the gate pad unit 14 and the data pad unit 15 are formed on edge areas of a thin film transistor array substrate 1 which does not overlap a color filter substrate 2. The gate pad unit 14 provides the gate lines of the image display unit 13 with a corresponding scan signal supplied from a gate driver integrated circuit, and the data pad unit 15 provides the data lines with image information supplied from a data driver integrated circuit.

On the thin film transistor array substrate 1 of the image display unit 13, the data lines having the image information applied thereto are arranged to perpendicularly cross the gate lines having the scan signals applied thereto. Then, thin film transistors are formed at each crossing to switch liquid crystal cells. Pixel electrodes are connected to the thin film transistors to drive the liquid crystal cells. A passivation layer is formed on the entire surface to protect the electrodes and the thin film transistors.

Also, color filters separated by a black matrix for each cell area are formed on the color filter substrate 2 of the pixel display unit 13. A transparent common electrode is formed on the thin film transistor array substrate 1.

A cell gap is provided between the thin film transistor array substrate 1 and the color filter substrate 2. The thin film transistor array substrate and color filter substrates are bonded to each other by a sealant (sealing unit) (not shown) formed at the peripheral regions of the image display unit 13, so as to be spaced apart from each other. A liquid crystal layer (not shown) is formed in the space between the thin film transistor array substrate 1 and the color filter substrate 2.

FIG. 2 is an exemplary view showing a cross-sectional structure of a first mother substrate having thin film transistor array substrate 1 and a second mother substrate having color filter substrates 2, wherein the first and second mother substrates are bonded to each other to form a plurality of liquid crystal display panels.

Referring to FIG. 2, each unit liquid crystal display panel has a thin film transistor array substrate 1 longer than the color filter substrate 2. This is because the gate pad unit 14 and the data pad unit 15 are formed, as illustrated in FIG. 1, at the edges of the thin film transistor array substrate 1, which does not overlap the color filter substrate 2.

Hence, the second mother substrate 30 and the color filter substrates 2 formed thereon are spaced apart from each other by a dummy region 31 corresponding to the protruding area of each thin film transistor array substrate 1 on the first mother substrate 20.

Moreover, the unit liquid crystal display panels are arranged so as to maximize the use of the first and second mother substrates 20 and 30. Although it depends on models, the unit liquid crystal display panel is generally spaced apart from each other at a distance corresponding to the area of the other dummy region 32.

After the first mother substrate 20 having the thin film transistor array substrates 1 is bonded to the second mother substrate 30 having the color filter substrates 2, a scribing process and a breaking process are carried out to individually cut the liquid crystal display panels.

The cutting process of the unit liquid crystal display panels will now briefly be explained.

FIG. 3 is a view illustrating an exemplary structure of a related art cutting apparatus used in the breaking process.

In FIG. 3, a related art apparatus for cutting a liquid crystal display panel may include a table 42, first and second mother substrates 20 and 30 loaded on the table 42 after completing the previous processes, and a cutting wheel 51 for processing the first and second mother substrates 20 and 30 and thus forming scribing lines thereon.

In the related art apparatus for cutting the liquid crystal display panel, when the first and second mother substrates 20 and 30, including a plurality of liquid crystal display panels, the first and second mother substrates 20 and 30 facing and being bonded to each other, are loaded on the table 42, the cutting wheel 51 positioned over the first and second mother substrates 20 and 30 moves in a downwardly direction, and then rotates under a particular applied pressure to the second mother substrate 30, to thus form a groove-shaped scribing line on the surface of the second mother substrate 30.

The scribing lines are also formed on the first mother substrate 20. That is, the cutting wheel 51 is used to process the first mother substrate 20 to form the scribing lines at the same positions as the subscribing lines 58 on the second mother substrate 30. Accordingly, in the related art apparatus for cutting the liquid crystal display panel, the first and second mother substrates 20 and 30 are processed separately to form the scribing lines thereon. Thus, the second mother substrate 30 is processed first using the cutting wheel 51. Thereafter, the first mother substrate 20 is processed using the cutting wheel 51 in a state that the first mother substrate 20 is laid upwardly by turning the liquid crystal display panel over.

Afterwards, the subscribing lines (i.e., scribing lines formed on both the first and second mother substrates 20 and 30) are pressed to divide the first and second mother substrates 20 and 30.

However, several problems may occur in the related art apparatus for cutting the liquid crystal display panel as follows.

In the related art apparatus for cutting the liquid crystal display panel, the cutting wheel 51 does not cut the first and second mother substrates 20 and 30 completely but just forms the scribing lines thereon. Other processes are further performed to completely cut the first and second mother substrates 20 and 30. That is, according to the later processes, the first and second mother substrates 20 and 30 are completely cut by applying an impact along the scribing lines formed thereon. Accordingly, the first and second mother substrates 20 and 30 are divided into the liquid crystal display panels.

Thus, forming the scribing lines is intended to prevent a defect from being generated when cutting the first and second mother substrates 20 and 30. That is, in the related art cutting apparatus, the first and second mother substrates 20 and 30 are processed according to separate processes to form the scribing lines on the respective first and second mother substrates 20 and 30. Pressure is applied to the first and second mother substrates 20 and 30 to thus cut them along their scribing lines at once. Thereby, dividing the first and second mother substrates 20 and 30. Accordingly, when the first mother substrate 20 or the second mother substrate 30 is processed using the cutting wheel 51, if the corresponding mother substrate is completely cut, an impact may be applied to the substrate, which faces and is bonded to the corresponding mother substrate, and thereby fabricate a defective liquid crystal display panel. Particularly, if the second mother substrate 30 is completely cut using the cutting wheel 51, when turning over the first and second mother substrates 20 and 30 bonded to each other, an impact may be applied to the first mother substrate 20, which may cause a defect.

In order to prevent such a defect, the scribing lines are separately formed on the first and second mother substrates 20 and 30, and then later processes are performed to completely divide the first and second mother substrates 20 and 30. Hence, the substrates 20 and 30 are not completely cut. Specifically, only the scribing lines are formed thereon by setting cutting conditions of the cutting wheel 51, for example, pressure applied to the cutting wheel 51, a rotating speed of the cutting wheel 51, or the like.

However, the mother substrates used in the liquid crystal display device fabricating process have various characteristics. In other words, because characteristics of glass substrate may be varied according to a type or fabricating company of the glass substrate, a size of the glass substrate, or the like, if another type of mother substrate is processed in an actual cutting process of liquid crystal display panel, the mother substrate is completely cut to thereby cause a defective liquid crystal display panel.

SUMMARY OF THE INVENTION

Accordingly, the present invention is directed to a liquid crystal display panel cutting system and method and liquid crystal display device fabricating method using the same that substantially obviate one or more of the problems due to limitations and disadvantages of the related art.

An advantage object of the present invention is to provide a liquid crystal display panel cutting system and a method thereof capable of preventing a damage on a cutting wheel caused when excessively cutting substrates by differently setting a driving condition of the cutting wheel which cuts substrates according to glass substrates.

Another advantage of the present invention is to provide a liquid crystal display device fabricating method using the liquid crystal display panel cutting system.

To achieve these and other advantages and in accordance with the purpose of the present invention, as embodied and broadly described herein, there is provided a liquid crystal display panel cutting system comprising a table on which a substrate is loaded, a cutting wheel arranged to form scribing lines on a surface of the substrate, and a controller for controlling a driving condition of the cutting wheel according to characteristics of the substrate to thus drive the cutting wheel.

In another embodiment of the present invention, a liquid crystal display panel cutting method comprises preparing a substrate having at least one liquid crystal display panel setting a driving condition of a cutting wheel according to characteristics of the substrate, and forming scribing lines on the substrate by driving the cutting wheel in accordance with the driving condition.

In another embodiment of the present invention, a liquid crystal display device fabricating method comprises providing first and second substrates, forming a thin film transistor on the first substrate, forming a color filter layer on the second substrate, setting a driving condition of a cutting wheel based on characteristics of the first and second substrates, and driving the cutting wheel according to the driving condition to divide the first and second substrates into a unit liquid crystal display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

In the present invention, a driving condition of a cutting wheel for cutting a liquid crystal display panel can be variably adjusted according to the types of glass substrates. Particularly, the driving condition of the cutting wheel is controlled according to characteristics of the glass substrates to effectively prevent fabrication of a defective liquid crystal display panel. Such cutting conditions are automatically varied based on information input in a cutting system, so as to enable a quick cutting process.

In the present invention, two cutting wheels for cutting the liquid crystal display panel are arranged to face each other. Thus, the first mother substrate and second mother substrate are simultaneously processed to enable quick processing of the liquid crystal display panel.

The first mother substrate is a thin film transistor array substrate, in which various signal lines and a pixel electrode are formed in a prior thin film transistor forming process. The second mother substrate is a color filter substrate, in which a color filter and a black matrix are formed in a prior color filter forming process. After performing the thin film transistor forming process and the color filter forming process, a liquid crystal layer is formed between the first and second mother substrates, which have been bonded to each other, using a vacuum injection method or a liquid crystal (LC) dispensing method (i.e., a method for spreading liquid crystal material over an entire substrate by bonding and pressing two substrates after directly dispensing liquid crystal material onto a substrate). Thereafter, a cutting process is initiated (loaded) to divide the bonded first and second mother substrates into separate liquid crystal display panels using the cutting wheels.

Hereinafter, a liquid crystal display panel cutting system according to the present invention will be explained in detail with reference to the attached drawings.

Figure 1:
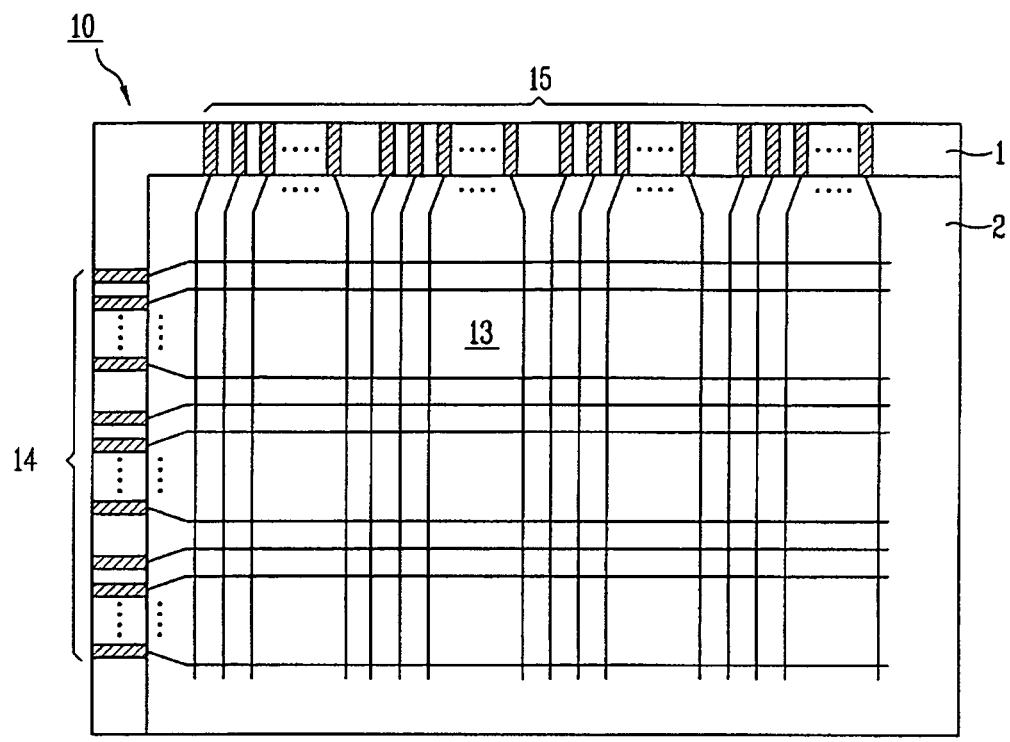
FIG. 1 is a plan view illustrating an exemplary structure of a related art liquid crystal display panel.
Figure 2:
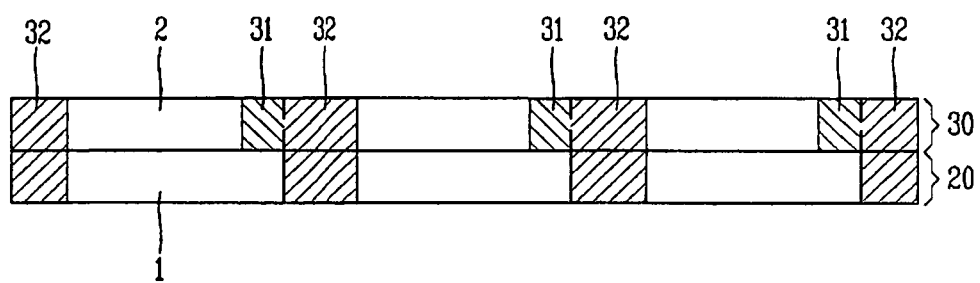
FIG. 2 is a cross-sectional view illustrating substrates having a plurality of liquid crystal display panels.
Figure 3:
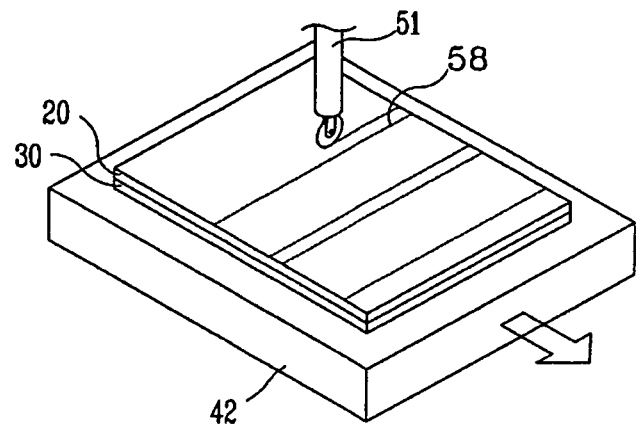
FIG. 3 is a view illustrating a related art liquid crystal display panel cutting apparatus.
Figure 4:
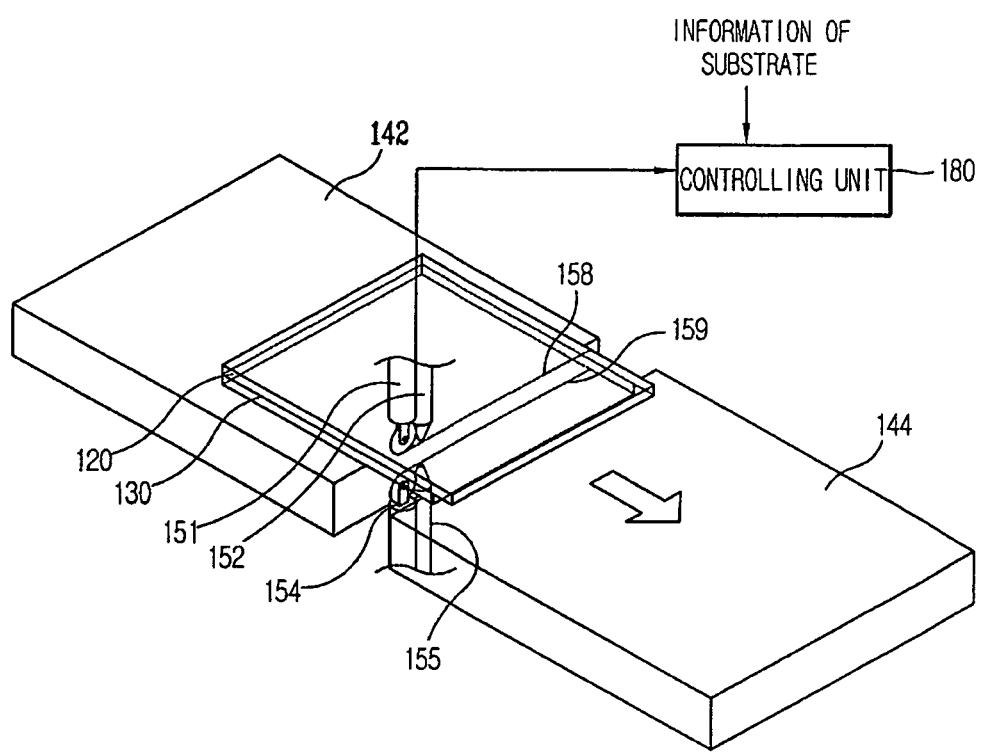
FIG. 4 is a view illustrating an exemplary structure of a liquid crystal display panel cutting system according to the present invention.

FIG. 4 is a view illustrating an exemplary liquid crystal display panel cutting system according to the present invention. As illustrated in FIG. 4, a liquid crystal display panel cutting system according to the present invention may comprise first and second tables 142 and 144 being uniformly spaced apart from each other, first and second mother substrates 120 and 130 loaded on the first and second tables 142 and 144 in a space between the first and second tables 142 and 144, first and second cutting wheels 151 and 154 for forming first and second scribing lines 158 and 159 on respective surfaces of the first and second mother substrates 120 and 130, and first and second suction units 152 and 155 installed at side surfaces of the first and second cutting wheels 151 and 154, for remaining glass-dust generated during the cutting process.

In the liquid crystal display panel cutting apparatus according to the present invention, after the thin film transistor forming process and the color filter forming process are performed to form the thin film transistor and the color filter on the first and second mother substrates 120 and 130, respectively, bonded first and second mother substrates 120 and 130 that face each other and have a plurality of liquid crystal display panels are loaded on the first and second tables 142 and 144, which are uniformly spaced apart from each other. The first and second substrates are located at spaces between the first and second tables 142 and 144. The first and second cutting wheels 151 and 154 vertically face each other at the space between the first and second tables 142 and 144. The first and second mother substrates 120 and 130 are positioned between the first and second wheels 151 and 154, and are adhered on surfaces of the first and second mother substrates 120 and 130 by applying a uniform pressure thereto to thus rotate. The first and second cutting wheels 151 and 154 simultaneously form groove-shaped first and second scribing lines 158 and 159 at the surfaces of the first and second mother substrates 120 and 130. Thereafter, pressure is applied to the first and second scribing lines 158 and 159 to divide the first and second mother substrates 120 and 130.

In the liquid crystal display panel cutting apparatus according to the present invention, the first and second cutting wheels 151 and 154 face each other. Thus, the first and second mother substrates 120 and 130 are cut by performing only one cutting process (i.e., a turn-over process of the related art is not required to cut the upper and lower substrates). Thereby, allowing the performance of a quick cutting process.

In the meantime, a controller 180 controls the first and second cutting wheels 151 and 154. The controller 180 does not simply drive the first and second cutting wheels 151 and 154, but rather drives the first and second cutting wheels 151 and 154, by varying their driving condition based upon the type of substrate (or a liquid crystal display panel) to be cut.

Referring to FIG. 4, the controller 180 input receives various information with respect to the substrates 120 and 130 from an exterior source. The controller 180 can control the driving condition of the first and second cutting wheels 151 and 154 (e.g., pressure applied to first and second substrates 120 and 140, a rotating speed of the cutting wheels 151 and 154, a driving time of the cutting wheels 151 and 154, and the like) based on the input characteristics (information) of the substrates 120 and 130 for example, substrate type, types, sizes, fabricating companies of substrates.

Figure 5:
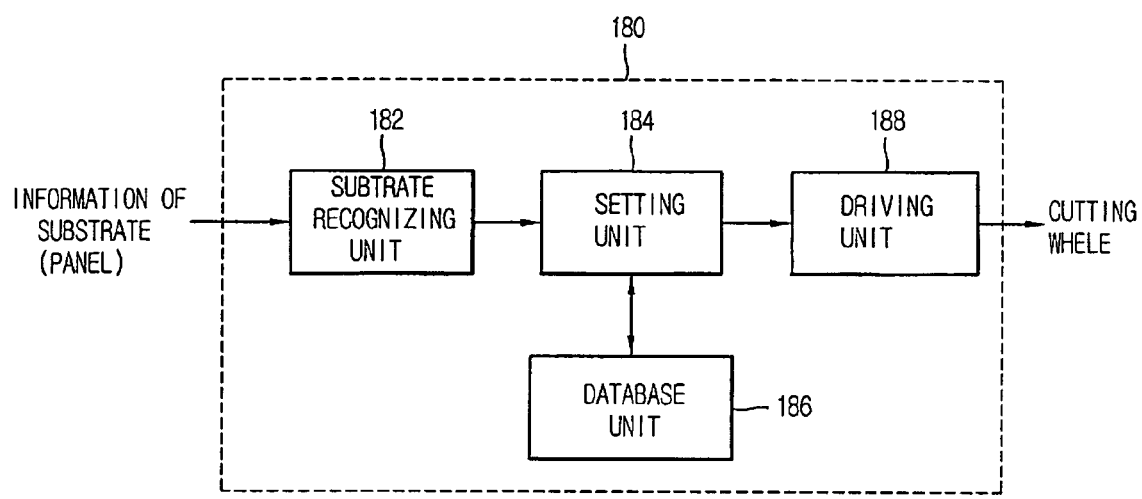
FIG. 5 is a block diagram illustrating an exemplary structure of a controller.

The controller 180, as illustrated in FIG. 5, may comprise a substrate recognizing unit 182 that recognizes the substrates 120 and 130 to be cut based on information with respect to the substrates 120 and 130 or panel input from a host computer, a database unit 186 in which cutting conditions of the first and second cutting wheels 151 and 154 corresponding to characteristics of the substrates 120 and 130 are stored, a setting unit 184 for searching for a driving condition of the first and second cutting wheels 151 and 154 corresponding to the substrate characteristics recognized by the substrate recognizing unit 182 from the database unit 186 to set the driving condition of the first and second cutting wheels 151 and 154, and a driving unit 188 for driving the first and second cutting wheels 151 and 154 of the liquid crystal display panel cutting apparatus in accordance with the driving condition set by the setting unit 184.

The information for the substrates or panels input to the controller 180 is input from a host computer of an entire liquid crystal display device fabricating system. The host computer refers to a computer for controlling the entire liquid crystal display device fabricating system, in which characteristics of each substrate 120 and 130 (e.g., strengths or fabricating companies of substrates) is stored as well as conditions of each process. Such information is input from the host computer to the substrate recognizing unit 182 which thus recognizes characteristics of the substrates (e.g., types or fabricating companies of the substrates) for which the cutting process is to be performed.

The driving condition of the cutting wheels 151 and 154 for each substrate is stored in the database unit 186. For example, a contact pressure, a rotating speed, and a driving time of the cutting wheels 151 and 154 with respect to a particular product of each fabricating company are stored in the database unit 186. The setting unit 184 sets the driving condition of the cutting wheels 151 and 154 with respect to a corresponding substrate recognized by the substrate recognizing unit 182 on the basis of the information stored in the database unit 186. The driving unit 188 drives the first and second cutting wheels 151 and 154 according to the set driving condition, to thus form the scribing lines for the liquid crystal display panel.

As mentioned above, in the present invention, the first and second substrates 120 and 130 are cut by varying their driving condition of the cutting wheels 151 and 154 according to the characteristics (or types) of glass substrates to be cut. Accordingly, it is possible to prevent damage on the first and second cutting wheels 151 and 154 due to the division of the first and second substrates 120 and 130.

The first and second cutting wheels 151 and 154, on the other hand, may be driven by driving conditions different from each other. The first substrate 120 and the second substrate 130 forming liquid crystal display panels may be formed of glass substrates having the same type or characteristics, or may be formed of glass substrates having a different type or characteristics from each other. Accordingly, the first cutting wheel 151 and the second cutting wheel 154 for processing the first substrate 120 and the second substrate 130 may be driven according to the same condition, or may be driven according to different conditions. In such manner, the first and second cutting wheels 151 and 154 controlled by the controller 180 may be integrally controlled, or may be separately controlled.

Hereinafter, a liquid crystal display panel cutting process using the liquid crystal display panel cutting apparatus of the present invention will now be explained in detail with reference to FIGS. 6A to 6F.

Figure 6A:
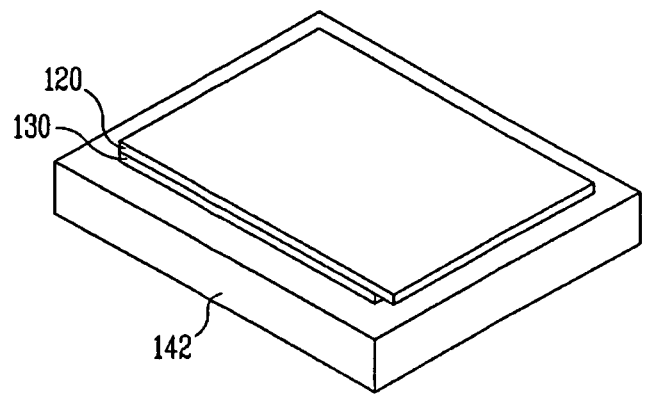
FIGS. 6A to 6F are views illustrating an exemplary liquid crystal display panel cutting method according to the present invention.

First, as illustrated in FIG. 6A, the first and second mother substrates 120 and 130 on which the thin film transistor array substrate and the color filter substrate are respectively formed are loaded on the first table 142. The first and second mother substrates 120 and 130 are facing and bonded to each other.

The first and second mother substrates 120 and 130 are loaded thereon in a state that the first mother substrate 120 having the thin film transistor array substrate is stacked on the second mother substrate 130 having the color filter substrate, which results in a more reducing of impact applied to the thin film transistor array substrate or the color filter substrate during the cutting process for the first and second mother substrates 120 and 130 as compared with stacking the two substrates vice versa.

Figure 6B:
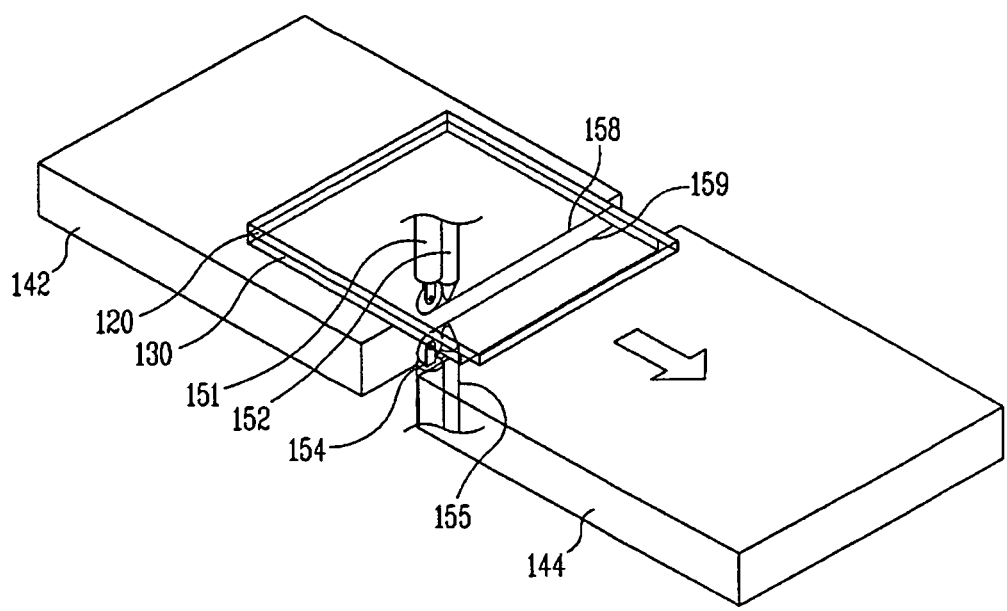

Afterwards, as illustrated in FIG. 6B, when the first and second mother substrates 120 and 130 are load on the first table 142 and a second table 144 apart from the first table 142, the first and second cutting wheels 151 and 154 are contacted with respective surfaces of the first and second mother substrates 120 and 130 by a uniform pressure at the space between the first and second tables 142 and 144 to thereafter rotate. First and second scribing lines 158 and 159 are sequentially formed on the respective surfaces of the first and second mother substrates 120 and 130 according to the rotations of the first and second cutting wheels 151 and 154. At this time, first and second suction units 152 and 155 are installed at side surfaces of the first and second cutting wheels 151 and 154 to remove glass-dust generated during the cutting process. The first and second suction units 152 and 155 interwork with the first and second cutting wheels 151 and 154 to remove the glass-dust which is generated at the surfaces of the first and second mother substrates 120 and 130 due to friction between the first and second cutting wheels 151 and 154 and the first and second mother substrates 120 and 130.

The controller 180 (not illustrated) controls the pressure by which the first cutting wheel 151 contacts the first substrate 120 and its rotating speed, and the pressure by which the second cutting wheel 154 contacts the second substrate 130 and its rotating speed.

Figure 6C:
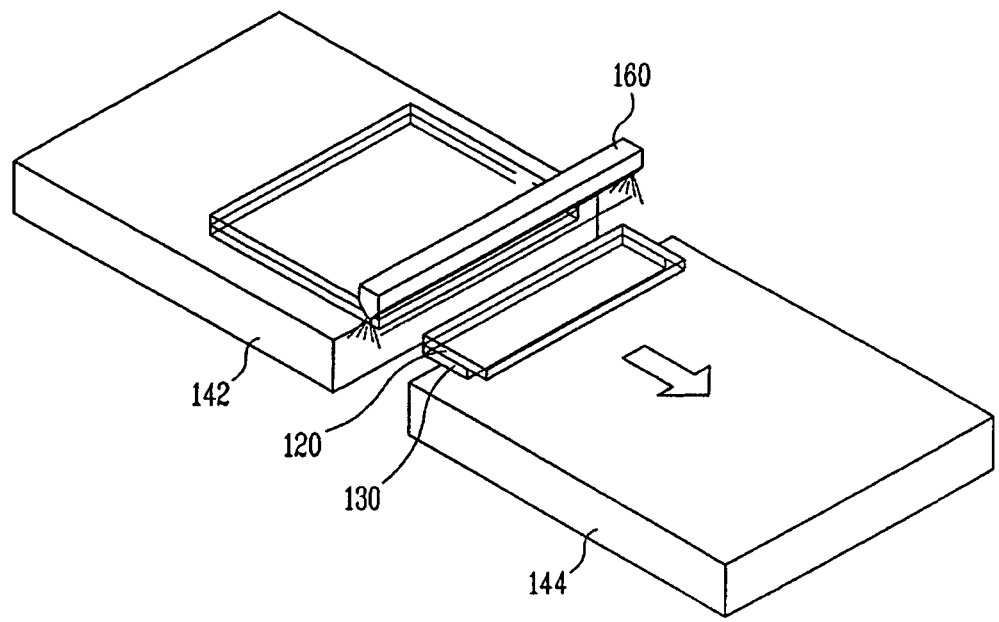

Afterwards, as illustrated in FIG. 6C, the first and second mother substrates 120 and 130 are sequentially cut using, for example, a steam cutting device 160. The steam of a high temperature, approximately 160-200° C. is applied to the first scribing line 158 and the second scribing line 159 to expand the first and second mother substrates 120 and 130 near the first scribing line 158 and the second scribing line 159. As a result, the first scribing line 158 and the second scribing line 159 are separated by the expansion of the substrates 120 and 130. Although not shown, the steam cutting device 160 interworks with the first cutting wheel 151 or the second cutting wheel 154 to apply steam along the first scribing line 158 or the second scribing line 159, so as to effectively separate the first scribing line 158 or the second scribing line 159.

Figure 6D:
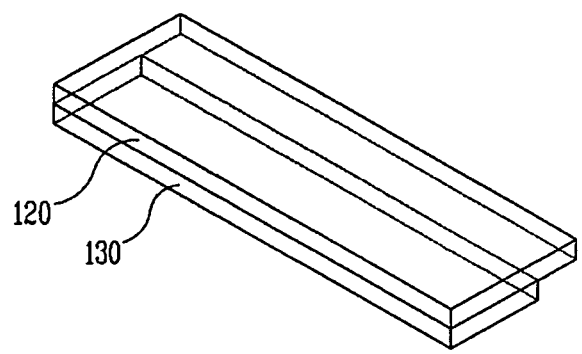

Thereafter, as illustrated in FIG. 6D, the cut first and second mother substrates 120 and 130 are rotated by about 90°.

Figure 6E:
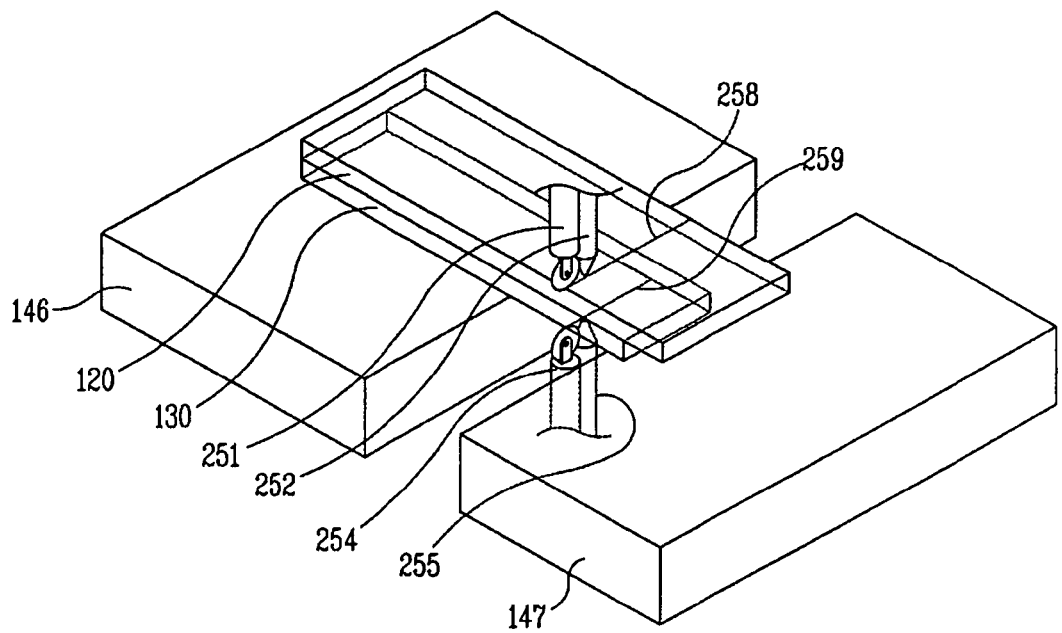

Then, as illustrated in FIG. 6E, the rotated first and second mother substrates 120 and 130 are moved on third and forth tables 146 and 147 which are uniformly spaced apart from each other. The substrates are located at the space therebetween. Third and fourth cutting wheels 251 and 254 are adhered onto the respective surfaces of the first and second mother substrates 120 and 130 by a uniform pressure at the space between the third and fourth tables 146 and 147 to thereafter rotate. As a result, third and fourth scribing lines 258 and 259 are formed on the respective surfaces of the first and second mother substrates 120 and 130 according to the rotations of the third and fourth cutting wheels 251 and 254. At this time, the controller 180 (not pictured) also controls the third and fourth cutting wheels 251 and 254 according to the type of the substrates. Meanwhile, third and fourth suction units 252 and 255 interwork with the third and fourth cutting wheels 251 and 254 to thus remove the glass-dust which is generated at the surfaces of the first and second mother substrates 120 and 130 due to friction between the third and fourth cutting wheels 251 and 254 and the first and second mother substrates 120 and 130.

Figure 6F:
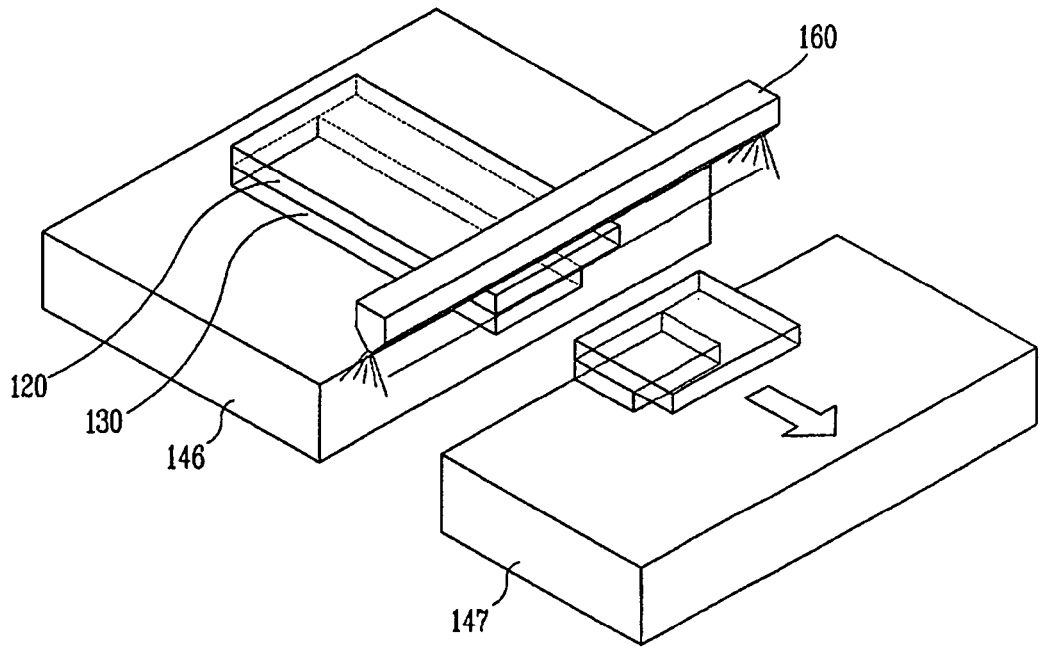

Afterwards, as illustrated in FIG. 6F, the first and second mother substrates 120 and 130 are cut by applying pressure to the third and fourth scribing lines 258, 259, respectively, thereon using the steam cutting device 160.

Although not shown in the drawing, the cut substrate, namely, the liquid crystal panel is transported to a later processing line using a transporting unit.

As described above, in the liquid crystal display panel cutting system according to the present invention, the driving of the cutting wheels is controlled according to the types or characteristics of the glass substrates, to thereby prevent defects caused by excessively cutting substrates. The substrates are cut by two cutting wheels that face each other, but can be cut by one cutting wheel. In this case, the cutting wheel may also be controlled by the types or characteristics of the glass substrates.

As explained above, in the present invention, the cutting wheels for cutting the liquid crystal display panel are driven by varying their driving condition based on the type or characteristics of the glass substrates. Thus, it is possible to prevent a fabrication of a defective liquid crystal display panel caused by previously cutting the mother substrates by an excessive cutting. Also, by using two cutting wheels facing each other, damage to the cutting wheels caused by directly contacting the two cutting wheels with each other by the excessive cutting can be prevented.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display panel cutting system, comprising:
    a table on which a first substrate and a second substrate attached together are loaded;
    a pair of cutting wheels facing each other for simultaneously forming scribing lines on surfaces of the first and second substrates; and
    a controller for controlling two different driving conditions of the cutting wheels according to characteristics of the first and second substrates, the controller including a recognizing unit for recognizing a substrate based on input information of substrates supplied from a host computer, a database unit in which the two different driving conditions of the pair of cutting wheels based upon the characteristics of the first and second substrates are stored, a setting unit for setting the two different driving conditions of the cutting wheels with respect to the first and second substrates to be processed based on the information stored in the database unit, and a driving unit arranged to drive the pair of cutting wheels according to the two different driving conditions set in the setting unit,
    wherein the input information of the substrates includes a type of substrate, a fabricating company of the substrate, and a size of the substrate, and wherein the two different driving conditions include contact pressure, rotating speed, and driving time of each of the pair of cutting wheels,
    wherein each of the pair of cutting wheels are separately driven by the two different driving conditions.

2. The system of claim 1, further comprising a suction unit for removing glass-dust generated by the cutting wheels.

3. The system of claim 2, wherein the suction unit interworks with the cutting wheels.

4. The system of claim 1, further comprising a steam cutting device for applying a high temperature steam to the scribing lines.

5. A fabricating method of a liquid crystal display device, comprising:
    providing a first substrate and a second substrate;
    forming a thin film transistor on the first substrate;
    forming a color filter layer on the second substrate;
    bonding the first substrate and the second substrate together;
    recognizing the first and second substrates based on input information of substrates supplied from a host computer, the input information of substrates including a type of substrate, a fabricating company of the substrate, and a size of the substrate;
    searching a database unit for two different driving conditions of a pair of cutting wheels corresponding to input information of the recognized first and second substrates, the two different driving conditions including contact pressure, rotating speed, and driving time of the pair of cutting wheels; and
    setting the two different driving conditions based on the input information with respect to the first and second substrates; and
    driving the pair of cutting wheels according to the set driving conditions to simultaneously form a first scribing line and a second scribing line on the first and second substrates,
    wherein each of the pair of cutting wheels are separately driven by the two different driving conditions.

6. The fabricating method of claim 5, wherein the dividing of the first and second substrates into the plurality of unit liquid crystal display panels includes:
    applying a high temperature steam to the first and second scribing lines to divide the substrates.

* * * * *